(12) United States Patent
Muto

(10) Patent No.: US 10,418,292 B2
(45) Date of Patent: Sep. 17, 2019

(54) MANUFACTURING METHOD OF SEMICONDUCTOR DEVICE, INSPECTION DEVICE OF SEMICONDUCTOR DEVICE, AND SEMICONDUCTOR DEVICE

(71) Applicant: RENESAS ELECTRONICS CORPORATION, Tokyo (JP)

(72) Inventor: Yu Muto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/892,841

(22) Filed: Feb. 9, 2018

(65) Prior Publication Data
US 2018/0277449 A1    Sep. 27, 2018

(30) Foreign Application Priority Data

Mar. 27, 2017   (JP) .................. 2017-061258

(51) Int. Cl.
*H01L 21/66*    (2006.01)
*H01L 21/48*    (2006.01)
(Continued)

(52) U.S. Cl.
CPC ............ *H01L 22/14* (2013.01); *G01R 1/0466* (2013.01); *G01R 1/0483* (2013.01);
(Continued)

(58) Field of Classification Search
CPC .............. H01L 22/14; H01L 23/49816; H01L 21/4853; H01L 22/32; H01L 24/13; H01L 2924/19105; H01L 2924/19041; H01L 2924/1434; H01L 2924/1432; H01L 2224/92125; H01L 2224/73204; H01L 2224/48227; H01L 2224/32225; H01L 2224/16227; H01L 2224/13144; H01L 24/92; H01L 24/73; H01L 24/48; H01L 24/32; H01L 24/16; H01L 2224/16225;
(Continued)

(56) References Cited

U.S. PATENT DOCUMENTS

2005/0260868 A1* 11/2005 Lee ................. H01R 13/2485
                                                     439/66
2006/0186905 A1*  8/2006 Kohashi ............. G01R 1/0466
                                                     324/750.25
(Continued)

FOREIGN PATENT DOCUMENTS

JP        2005-241426 A      9/2005

*Primary Examiner* — Thanh T Nguyen
(74) *Attorney, Agent, or Firm* — McDermott Will & Emery LLP

(57) ABSTRACT

A subject matter of this invention is that a manufacturing yield of a semiconductor device is improved.
A resistance value between a pogo pin and a test pin is measured by bringing a plurality of pogo pins of a socket mounted over a test board included in an inspection device of a semiconductor device into contact with a plurality of solder balls, respectively, and bringing the test pin provided in the socket into contact with a first solder ball of a plurality of solder balls at a position different from a position where the pogo pin is brought into contact with the first solder ball. Thereby, a coupling failure between the pogo pin and the first solder ball is detected, so that a conductive state is inspected.

8 Claims, 12 Drawing Sheets

(51) Int. Cl.
*H01L 23/498* (2006.01)
*G01R 1/04* (2006.01)
*G01R 31/04* (2006.01)
*H01L 23/00* (2006.01)
*G01R 27/20* (2006.01)

(52) U.S. Cl.
CPC ........ *G01R 31/045* (2013.01); *H01L 21/4853* (2013.01); *H01L 23/49816* (2013.01); *G01R 27/205* (2013.01); *H01L 22/32* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 2224/13144* (2013.01); *H01L 2224/16225* (2013.01); *H01L 2224/16227* (2013.01); *H01L 2224/32225* (2013.01); *H01L 2224/48227* (2013.01); *H01L 2224/73204* (2013.01); *H01L 2224/92125* (2013.01); *H01L 2924/1432* (2013.01); *H01L 2924/1434* (2013.01); *H01L 2924/15311* (2013.01); *H01L 2924/18161* (2013.01); *H01L 2924/19041* (2013.01); *H01L 2924/19105* (2013.01)

(58) Field of Classification Search
CPC . H01L 2924/18161; H01L 2924/15311; G01R 31/045; G01R 1/0466; G01R 1/0483; G01R 27/205
See application file for complete search history.

(56) References Cited

U.S. PATENT DOCUMENTS

| | | | |
|---|---|---|---|
| 2011/0237065 A1* | 9/2011 | Kawashiro | B23K 1/0016 438/615 |
| 2013/0224891 A1* | 8/2013 | Takizawa | H01L 22/10 438/15 |
| 2018/0106835 A1* | 4/2018 | Tong | G01R 1/0466 |

* cited by examiner

FIG. 9
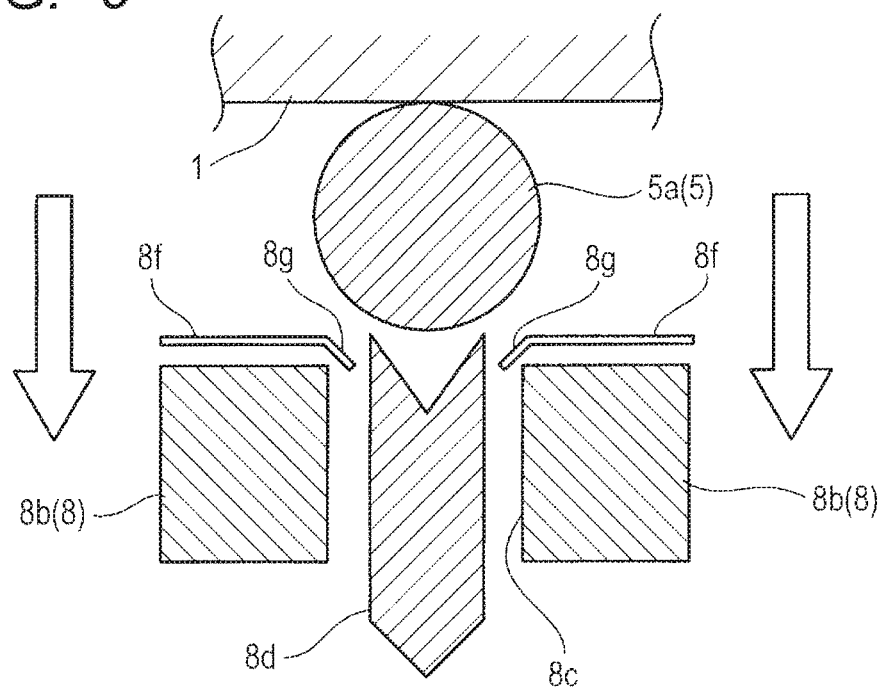
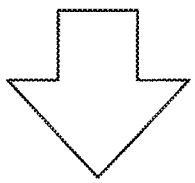
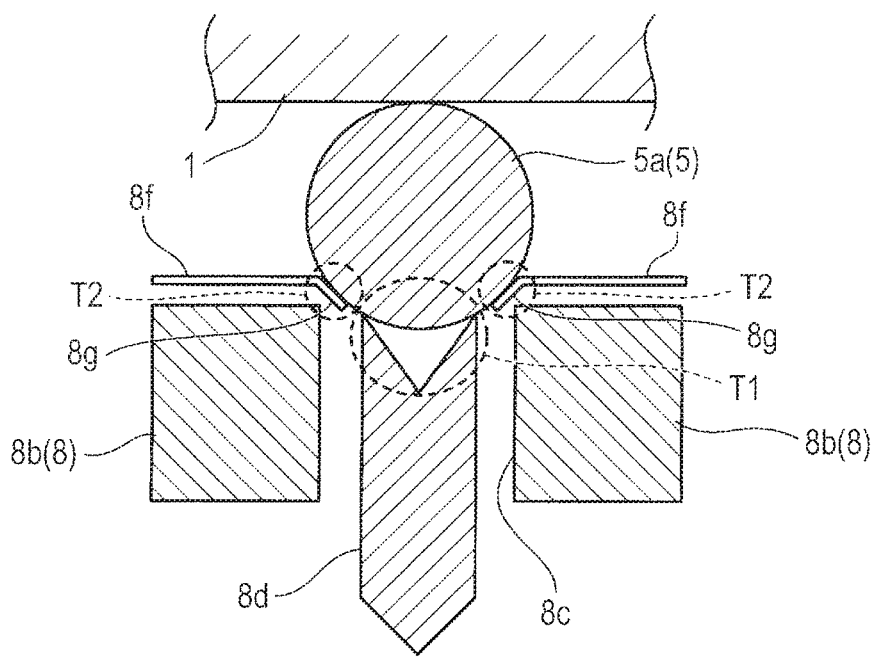

MANUFACTURING METHOD OF SEMICONDUCTOR DEVICE, INSPECTION DEVICE OF SEMICONDUCTOR DEVICE, AND SEMICONDUCTOR DEVICE

CROSS-REFERENCE TO RELATED APPLICATIONS

The disclosure of Japanese Patent Application No. 2017-061258 filed on Mar. 27, 2017 including the specification, drawings and abstract is incorporated herein by reference in its entirety.

BACKGROUND

The present invention relates to a manufacturing method of a semiconductor device, an inspection device of a semiconductor device, and a semiconductor device, where the semiconductor device is inspected by using a socket.

In a testing process of a semiconductor device after being assembled, an inspection of the semiconductor device is performed by inserting the semiconductor device into an IC socket (hereinafter simply referred to as a socket).

For example, external terminals of a BGA (Ball Grid Array) type semiconductor device are ball electrodes, so that the test is performed by pressing the BGA into a socket and bringing the ball electrodes into contact with pogo pins which are test terminals provided in the socket.

Regarding a technique for performing an inspection by inserting a BGA package into a socket, for example, Japanese Unexamined Patent Application Publication No. 2005-241426 discloses a technique of performing an inspection after removing oxide films on surfaces of solder balls.

SUMMARY

In the technique for performing an inspection by inserting a BGA into a socket, solder balls (ball electrodes) are mounted on a lower surface of a substrate installed in the BGA and the solder balls are mechanically brought into contact with pogo pins for contact provided inside the socket, so that the solder balls and the pogo pins are electrically brought into contact with each other and various tests are performed.

The inventors of the present application have found out the problems as described below in a method of electrical coupling by the mechanical contact of the pogo pins and the solder balls described above.

First, in the method of bringing the solder balls of the BGA and the pogo pins of the socket into contact with each other, contamination due to solder occurs on the pogo pins when the contact is repeated. Then, due to the contamination, a contact resistance between the pogo pin and the solder ball changes, and in particular, an operation is adversely affected in a test that operates a semiconductor device at high speed and a measurement value different from an actual value is measured, so that the semiconductor device is determined as pseudo failure.

Second, there is no method for clearly detecting the pseudo failure mentioned above, so that a countermeasure is taken such as performing a maintenance of the socket on the basis of, for example, the number of insertion/removal times from a record of occurrence of failure in a mass production process and a trial manufacturing process.

Further, the product cost of the semiconductor device tends to rise as the performance thereof increases, and therefore importance of quality improvement and loss cost reduction increases. In the case of the above method, there are problems that it takes long time for evaluation and adjustment when a condition (product design, process, or the like) changes, a failure cannot be detected unless a certain number of failures occur (regarding a test board mounted with a plurality of sockets that are generally used, it is not possible to determine contact of each socket), and detection sensitivity of a product whose failure rate is high is low (it is difficult to differentiate from contact failure).

The other problems and novel features will become apparent from the description of the present specification and the accompanying drawings.

A manufacturing method of a semiconductor device according to an embodiment includes the steps of (a) inserting a semiconductor device including a wiring substrate provided with a plurality of ball electrodes as external terminals into an inspection socket and (b) bringing a plurality of first terminals provided in the socket into contact with the ball electrodes, respectively, bringing a second terminal provided in the socket into contact with a first ball electrode of the ball electrodes, and inspecting a conductive state between the first terminal and the first ball electrode. Further, in the step (b), a coupling failure between the first terminal and the first ball electrode is detected by measuring a resistance value between the first terminal and the second terminal by bringing the second terminal into contact with the first ball electrode from a direction different from a direction in which the first terminal is brought into contact with the first ball electrode.

An inspection device of a semiconductor device according to an embodiment includes a test board mounted with a socket that houses a semiconductor device including a wiring substrate provided with a plurality of ball electrodes as external terminals and includes a plurality of first terminals arranged corresponding to the ball electrodes respectively and a second terminal that can come into contact with a first ball electrode of the ball electrodes; and a measuring instrument that is electrically coupled with the test board and transmits an inspection signal to the semiconductor device through the first terminals and the ball electrodes. In a state in which the semiconductor device is inserted into the socket, a coupling failure between the first terminal and the first ball electrode is detected by measuring a resistance value between the first terminal and the second terminal by bringing the first terminals into contact with the ball electrodes, respectively, and bringing the second terminal into contact with the first ball electrode from a direction different from a direction in which the first terminal is brought into contact with the first ball electrode.

A semiconductor device according to an embodiment includes a semiconductor chip, a wiring substrate which includes a first surface and a second surface located opposite to the first surface and in which the semiconductor chip is mounted over the first surface, and a plurality of ball electrodes provided on the second surface of the wiring substrate. Further, the wiring substrate includes an inspection terminal, which is provided adjacent to a first ball electrode of the ball electrodes and is electrically coupled to the first ball electrode and where no ball electrode is mounted, on the second surface, and the inspection terminal is arranged inside a plurality of second ball electrodes provided on an outermost circumference of the ball electrodes.

According to an embodiment, it is possible to improve a manufacturing yield of a semiconductor device by reducing occurrence of pseudo failure in an inspection process during an assembly of the semiconductor device.

BRIEF DESCRIPTION OF THE DRAWINGS

FIG. 9 is a schematic diagram showing an example of an inspection status of a semiconductor device of a second embodiment.

DETAILED DESCRIPTION

In the embodiments described below, in principle, the same or similar component will not be repeatedly described unless otherwise required.

Further, the following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

In the following embodiments, it is needless to say that an element (including an element step etc.) is not necessarily indispensable, except for the case where it is clearly specified in particular and where it is considered to be clearly indispensable from a theoretical point of view, etc.

In the following embodiments, when shape, position relationship, etc. of an element etc. are referred to, what resembles or is similar to the shape, etc. substantially shall be included, except for the case where it is clearly specified in particular and where it is considered to be clearly not right from a theoretical point of view. This statement also applies to the numeric value and range described above.

Hereinafter, embodiments of the present invention will be described with reference to the drawings. In all the drawings for explaining the embodiments, the same symbol is attached to members having the same function, as a principle, and the repeated explanation thereof is omitted. In order to make a drawing intelligible, hatching may be attached even if it is a plan view.

First Embodiment

Configuration of Semiconductor Device

Figure 1:
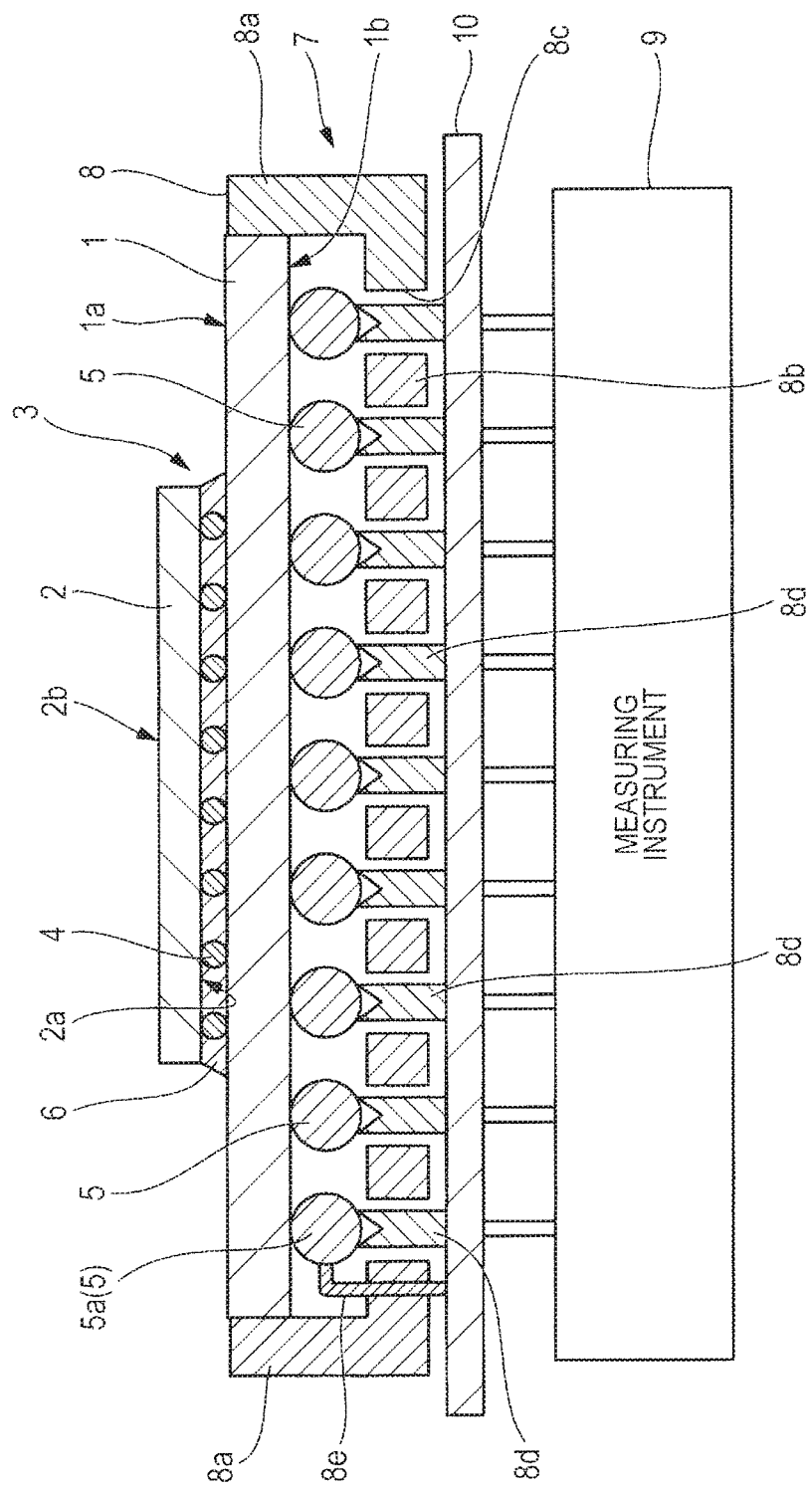
FIG. 1 is a schematic diagram showing an example of an inspection status of a semiconductor device of a first embodiment.

FIG. 1 is a schematic diagram showing an example of an inspection status of a semiconductor device of a first embodiment.

A structure of the semiconductor device to be inspected in the first embodiment will be described.

The semiconductor device shown in FIG. 1 is a substrate-type semiconductor package in which a semiconductor chip 2 is mounted (bonded, coupled, or packaged) on a package substrate (a wiring substrate) 1. A plurality of external terminals provided on the lower surface of the package substrate 1 are solder balls (ball electrodes) 5. That is, the semiconductor device of the first embodiment is a BGA (Ball Grid Array) 3.

A configuration of the BGA 3 will be described. The BGA 3 includes the semiconductor chip 2, the package substrate 1 where the semiconductor chip 2 is supported or mounted, and a plurality of bumps 4 which are arranged between a main surface (a surface) 2a of the semiconductor chip 2 and an upper surface (a first surface) 1a of the package substrate 1 and which electrically couple the semiconductor chip 2 and the package substrate 1.

In other words, the semiconductor chip 2 is flip-chip mounted over the package substrate 1. The BGA 3 has an underfill 6 that is a resin material filled in a gap between the semiconductor chip 2 and the package substrate 1. A flip-chip coupled portion is protected by the underfill 6.

Figure 16:
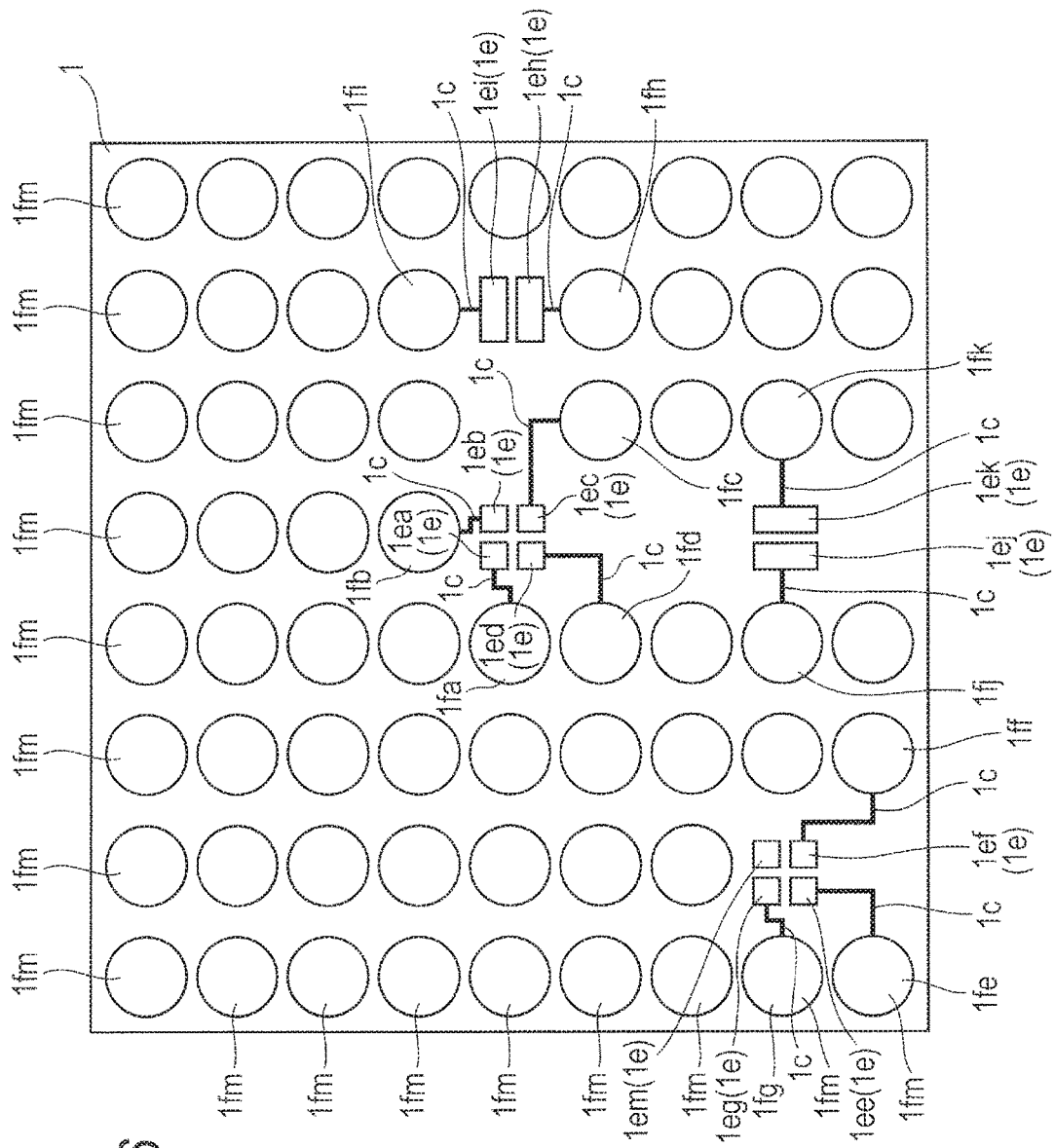
FIG. 16 is an enlarged backside view showing an example of an arrangement of inspection terminals in the semiconductor device of the third embodiment.

A plurality of solder balls 5, which are area-array-arranged (lattice-like arranged) as shown in FIG. 16 described later, are provided as external terminals of the BGA 3 on a lower surface (a second surface) 1b located opposite to the upper surface 1a of the package substrate 1.

The configuration of the BGA 3 will be described further in detail. A planar shape of the semiconductor chip 2 is square or rectangle. The semiconductor chip 2 is formed by forming various semiconductor elements or semiconductor integrated circuits on a main surface of a semiconductor substrate (semiconductor wafer) composed of single crystal silicon and thereafter dividing the semiconductor substrate into each semiconductor chip 2 by dicing or the like.

The semiconductor chip 2 has a main surface (a surface on which the semiconductor elements are formed) 2a and a back surface (a surface opposite to the surface on which the semiconductor elements are formed) 2b located opposite to the main surface 2a. The semiconductor chip 2 is mounted (arranged) so that the main surface 2a faces the upper surface 1a of the package substrate 1. Therefore, the back surface 2b of the semiconductor chip 2 faces upward.

The package substrate 1, which is a wiring substrate, is also referred to as a BGA substrate and is composed of, for example, a resin material and a conductive material. Further, the package substrate 1 has the upper surface 1a where the semiconductor chip 2 is mounted and the lower surface 1b where a plurality of solder balls 5 are provided. The semiconductor chip 2 facing the upper surface 1a and the solder balls 5 facing the lower surface 1b are electrically coupled by conductive portions such as wiring and vias formed on the surfaces and inside of the package substrate 1.

The solder balls 5 are arranged on the lower surface 1b of the package substrate 1 in an array shape (lattice shape) and function as external terminals of the BGA 3.

Here, the bumps 4 for flip-chip mounting are, for example, gold bumps.

The underfill 6 is composed of, for example, a resin material such as a thermosetting resin material.

About Inspection Device of Semiconductor Device

An inspection device used to inspect the BGA 3 shown in FIG. 1 will be described. The inspection device 7 of the BGA (semiconductor device) 3 includes a test board 10 where a socket 8 capable of housing the BGA 3 is mounted, and a measuring instrument 9 which is a tester that transmits a predetermined inspection signal to the BGA 3 through a plurality of pogo pins (first terminals) 8d which are provided in the socket 8 and electrically coupled with the test board 10 and a plurality of solder balls (ball electrodes) 5 that are external terminals of the BGA 3.

That is, the inspection (test) of the semiconductor device including the BGA 3 is to input a signal into the semiconductor device and examine a response of the semiconductor device to the signal. In the inspection, the signal is formed in the measuring instrument 9, propagates through a conductive pattern, which is formed in the test board 10 and is not shown in the drawings, reaches the pogo pins 8d, and further propagates to the semiconductor device (BGA 3) through the solder balls 5. A response signal from the semiconductor device propagates in reverse order and returns to the measuring instrument 9. Then, the measuring instrument 9 determines whether or not a response result is coincident with an expected value.

A plurality of pogo pins (first terminals) 8d that respectively come into contact with a plurality of solder balls 5 of the BGA 3 and a test pin (second terminal) 8e that can come into contact with a first solder ball (first ball electrode) 5a of the plurality of solder balls 5 are provided inside the socket 8 of the first embodiment. The test pin 8e is also called a reference pin or the like.

The socket 8 has a bottom portion 8b where a plurality of hole portions 8c into which a plurality of pogo pins 8d are arranged respectively are formed and side walls 8a that are bonded with the bottom portion 8b and form a space that houses the semiconductor device.

In other words, the plurality of pogo pins 8d and the test pin 8e different from the pogo pins 8d are provided inside the socket 8.

Then, in the inspection of the BGA 3 of the first embodiment, a resistance value between the pogo pin 8d and the test pin 8e is measured by bringing the plurality of pogo pins 8d into contact with the plurality of solder balls 5, respectively, and bringing the test pin 8e into contact with the first solder ball 5a at a position different from a position where the pogo pin 8d is brought into contact with the first solder ball 5a, in a state in which the BGA 3 is inserted into the socket 8. A coupling failure between the pogo pin 8d and the first solder ball 5a is detected by the measurement of the resistance value. In other words, a conductive state between the pogo pin 8d and the first solder ball 5a is inspected.

The first solder ball 5a is preferred to be, for example, a solder ball 5 arranged at a corner portion or a solder ball 5 arranged at an end portion of any of columns among the plurality of solder balls 5 arranged in a lattice shape. It is possible to easily arrange the test pin 8e in the socket 8 by employing a first solder ball 5a arranged at a corner portion or an end portion as a solder ball 5 where the conductivity inspection is performed.

Manufacturing Method of Semiconductor Device

First, details of problems to be solved by the present application discussed by the inventors will be described.

In a method in which the BGA 3 is inserted into the socket 8 and an electrical inspection is performed, the pogo pins 8d of the socket 8 and the solder balls 5 of the BGA 3 are mechanically brought into contact with each other. Due to the above structure, there is room for a foreign object to be caught between the pogo pin 8d and the solder ball 5. Even if there is no typical foreign object, when the solder balls 5 of the BGA 3 and the pogo pins 8d of the socket 8 come into contact with each other, contamination occurs, such as a solder scrap of the solder ball 5 adheres to the pogo pin 8d, or a protective film on the surface of the pogo pin 8d is peeled off, or further a remaining chemical liquid or the like adheres to the pogo pin 8d when flux cleaning is performed after the solder balls are mounted.

Then, due to the contamination described above, a contact resistance between the pogo pin 8d and the solder ball 5 changes. The change of the contact resistance is irregular and gives influence such as delay and S/N ratio (ratio of noise to signal) degradation to a signal applied from the measuring instrument 9.

In particular, this may cause underestimation compared to performance of an actual product when evaluating a function of a semiconductor device that operates at high speed. As a result, the semiconductor device may be determined as failure. This is called a pseudo failure. It is difficult to differentiate the pseudo failure from the other defects (it is difficult to conclude that the pseudo failure is due to a contact failure), so that a countermeasure is taken by only estimating a state of contamination by observing changes in a failure occurrence rate and the like.

Therefore, in the manufacturing method of the semiconductor device of the first embodiment, the degradation of the contact resistance between the solder ball 5 and the pogo pin 8d due to the contamination is detected. At this time, the test pin 8e arranged at a position different from the pogo pin 8d is brought into contact with the solder ball 5 at an arbitrary timing. Then, it is possible to measure the resistance value between the pogo pin 8d and the solder ball 5 by measuring the resistance value between the test pin 8e and the pogo pin 8d. Further, it is possible to identify a defect due to contact failure by monitoring the state of contamination.

Figure 2:
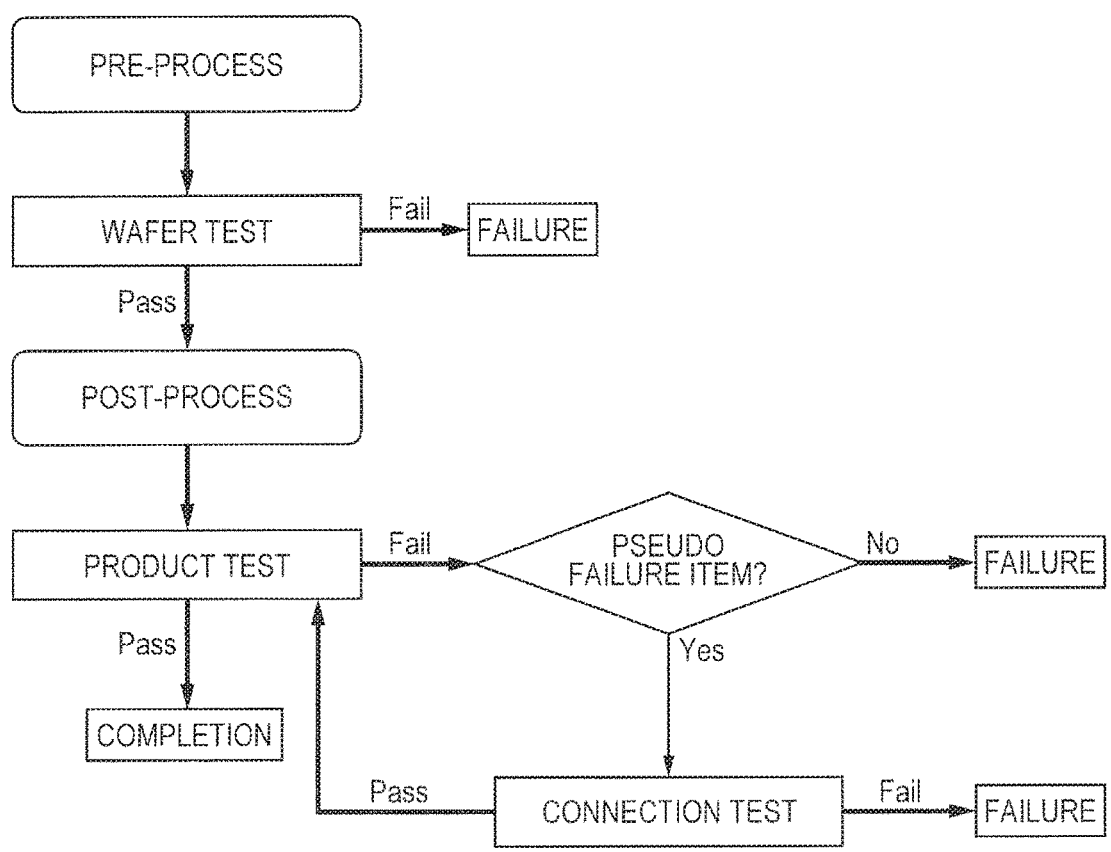
FIG. 2 is a flowchart showing an example of an assembly procedure of a manufacturing method of the semiconductor device of the first embodiment.

Next, FIG. 2 is a flowchart showing an example of an assembly procedure of the manufacturing method of the semiconductor device of the first embodiment. A timing of performing the inspection of the semiconductor device of the first embodiment will be described with reference to FIG. 2.

First, the semiconductor device is assembled according to processes (steps) shown in FIG. 2. Specifically, a wafer is formed by performing a pre-process and thereafter a wafer test is performed. In the wafer test, a failed wafer is removed (Fail). A wafer that has passed the wafer test is transferred to a post-process (Pass), and assembly of the semiconductor device is performed.

After the semiconductor device has been assembled, a product test of the semiconductor device is performed. Here, the BGA 3 is inserted into the socket 8 and the pogo pins 8d are brought into contact with the plurality of solder balls 5, respectively. In this state, the product test (defective/non-defective determination test) is performed. A semiconductor device that has passed the product test becomes a product (Pass). On the other hand, when the semiconductor device is determined as failure, in the next step, it is determined whether or not an item that is determined as failure in the product test is an item corresponding to a pseudo failure.

For example, in the case of a short-circuit failure, it is determined that the short-circuit failure does not correspond to a pseudo failure item (NO), so that the semiconductor device is determined as failure.

When characteristics are unstable, it corresponds to a pseudo failure (YES), and a coupling test (the inspection of the semiconductor device of the first embodiment) is performed in the next step. When a failure is determined in the coupling test, the semiconductor device is determined as failure. On the other hand, the product test is performed again on the semiconductor device (BGA 3) that has passed the coupling test (Pass). Specifically, regarding the semiconductor device that has passed the coupling test (Pass), the BGA 3 is inserted into the socket 8, the pogo pin 8d is brought into contact with at least the first solder ball 5a, and the product test (defective/non-defective determination test) of the BGA 3 is performed.

Next, the inspection (the coupling test described above) of the semiconductor device of the first embodiment will be described.

Figure 3:
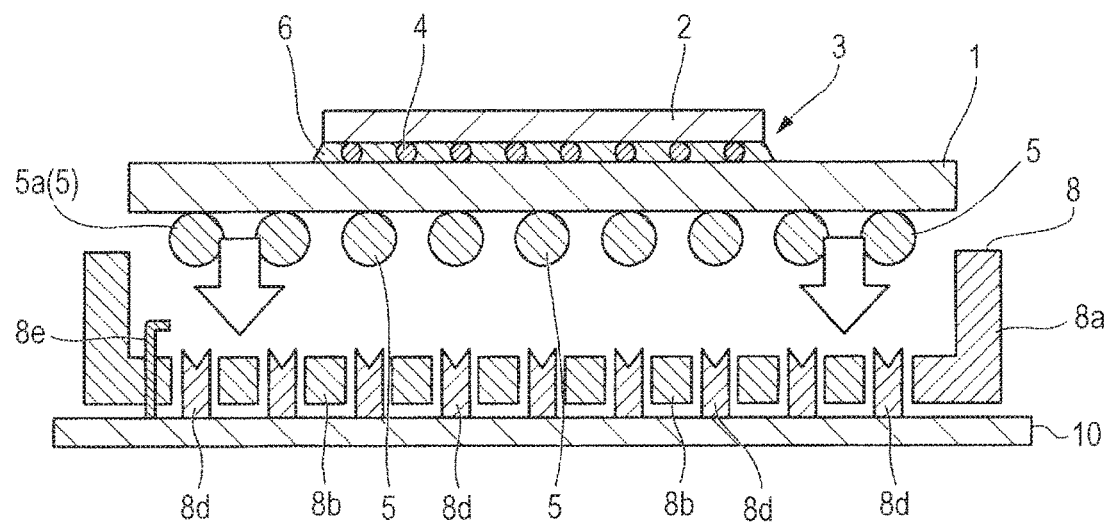
FIG. 3 is a schematic diagram showing a method of inserting the semiconductor device into a socket in an inspection process of the semiconductor device of the first embodiment.
Figure 4:
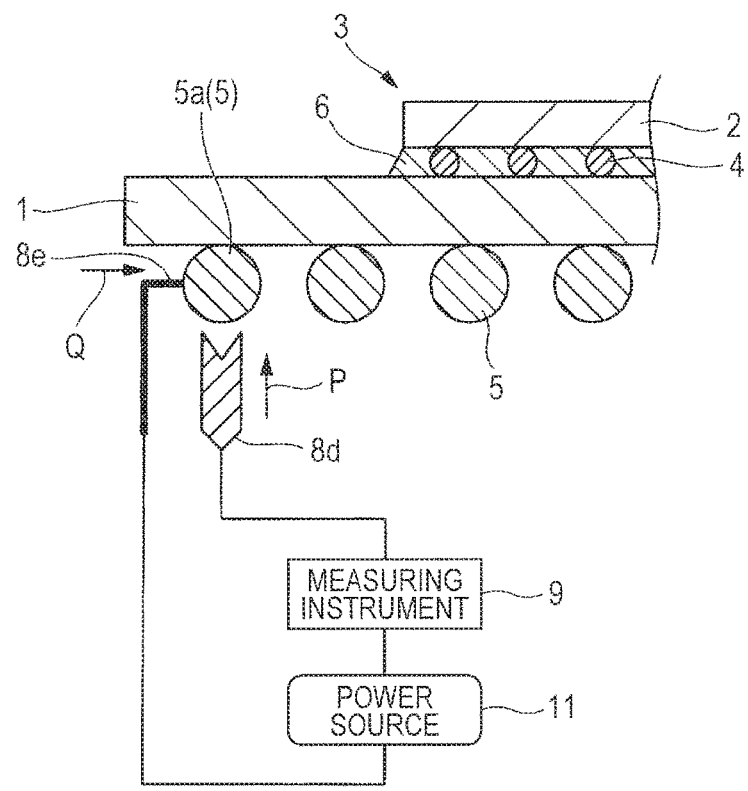
FIG. 4 is an enlarged schematic diagram showing the inspection status of the semiconductor device shown in FIG. 1.

FIG. 3 is a schematic diagram showing a method of inserting the semiconductor device into the socket in an inspection process of the semiconductor device of the first embodiment. FIG. 4 is an enlarged schematic diagram showing the inspection status of the semiconductor device shown in FIG. 1.

In the coupling test shown in FIG. 2, first, as shown in FIG. 3, the BGA 3 including the package substrate 1 provided with a plurality of solder balls 5 as external terminals is inserted into the socket 8 for inspection.

Then, as shown in FIG. 1, a conductive state between the pogo pin 8d and the first solder ball 5a is inspected by bringing the plurality of pogo pins 8d provided in the socket 8 into contact with the plurality of solder balls 5, respectively, and bringing the test pin 8e provided in the socket 8 into contact with the first solder ball 5a of the plurality of solder balls 5.

In the inspection described above, as shown in FIG. 4, an inspection signal formed by the measuring instrument 9 coupled with the power source 11 is inputted into the first solder ball 5a of the BGA 3 through the pogo pin 8d. In this case, a resistance value between the pogo pin 8d and the first solder ball 5a is measured by bringing the test pin 8e into contact with the first solder ball 5a at a position different from a position where the pogo pin 8d is brought into contact with the first solder ball 5. Thereby, a coupling failure between the pogo pin 8d and the first solder ball 5a is detected.

Figure 5:
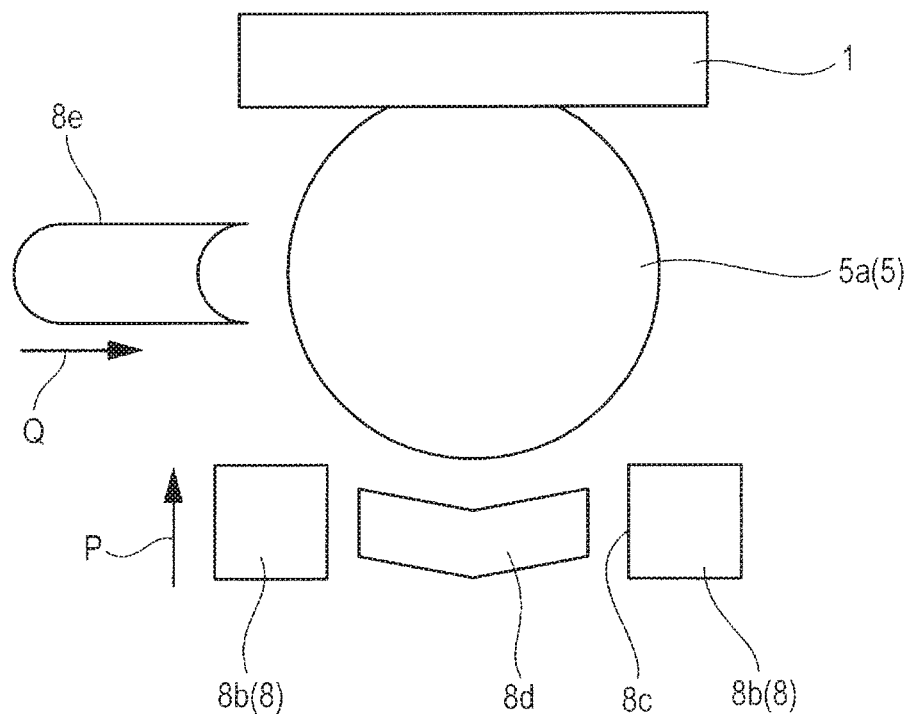
FIG. 5 is a schematic diagram showing a positional relationship among a ball electrode, a first terminal, and a second terminal in the inspection status of the semiconductor device shown in FIG. 1.
Figure 6:
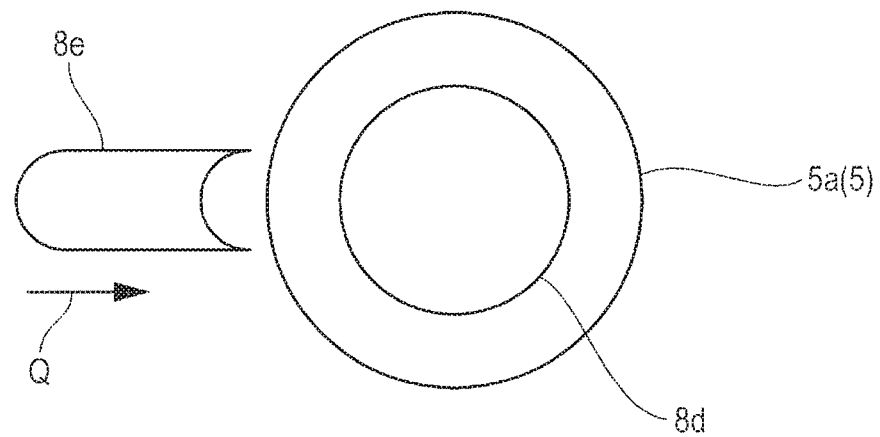
FIG. 6 is a schematic upper view of a structure shown in FIG. 5.

Here, FIG. 5 is a schematic diagram showing a positional relationship among the ball electrode, the first terminal, and the second terminal in the inspection status of the semiconductor device shown in FIG. 1. FIG. 6 is a schematic upper view of a structure shown in FIG. 5. That is, FIGS. 5 and 6 show a positional relationship among the first solder ball 5a, the pogo pin 8d, and the test pin 8e). The pogo pin 8d is arranged below the first solder ball 5a, which is a solder ball 5 to be inspected. On the other hand, the test pin 8e is arranged along a horizontal direction of the first solder ball 5a.

That is, in the socket 8, the test pin 8e is arranged at a position different from an array of a plurality of pogo pins 8d. Therefore, during the inspection, it is possible to bring the test pin 8e into contact with the first solder ball 5a from a direction different from a direction in which pogo pin 8d is brought into contact with the first solder ball 5a. For example, as shown in FIGS. 4 to 6, the pogo pin 8d is brought into contact with the first solder ball 5a along a P direction (a direction in which the pogo pin 8d moves up and down) from below the package substrate 1, on the other hand, the test pin 8e is brought into contact with the first solder ball 5a from a direction along a Q direction that is a direction horizontal to the package substrate 1, and the conductivity inspection is performed in this state. In other words, the test pin 8e is brought into contact with the first solder ball 5a from a direction along a surface (the lower surface 1b shown in FIG. 1) where a plurality of solder balls 5 are provided to the package substrate 1.

In this way, the test pin 8e is brought into contact with the first solder ball 5a from a direction different from a direction in which pogo pin 8d is brought into contact with the first solder ball 5a, so that it is possible to prevent the pogo pin 8d and the test pin 8e from interfering with each other.

Further, as shown in FIG. 5, during the inspection, the test pin 8e is brought into contact with the first solder ball 5a at a position closer to the package substrate 1 than a position where the pogo pin 8d is brought into contact with the first solder ball 5a. Specifically, the test pin 8e is brought into contact with the first solder ball 5a at a position upper than the position where the pogo pin 8d is brought into contact with the first solder ball 5a.

Figure 7:
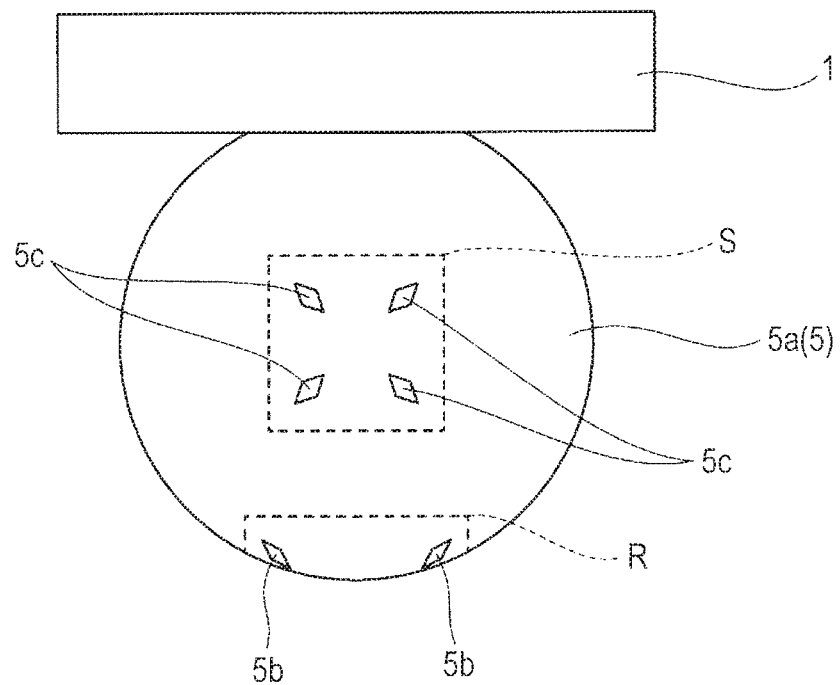
FIG. 7 is a partial side view showing an example of indentations on the ball electrode after inspection of the semiconductor device of the first embodiment.
Figure 8:
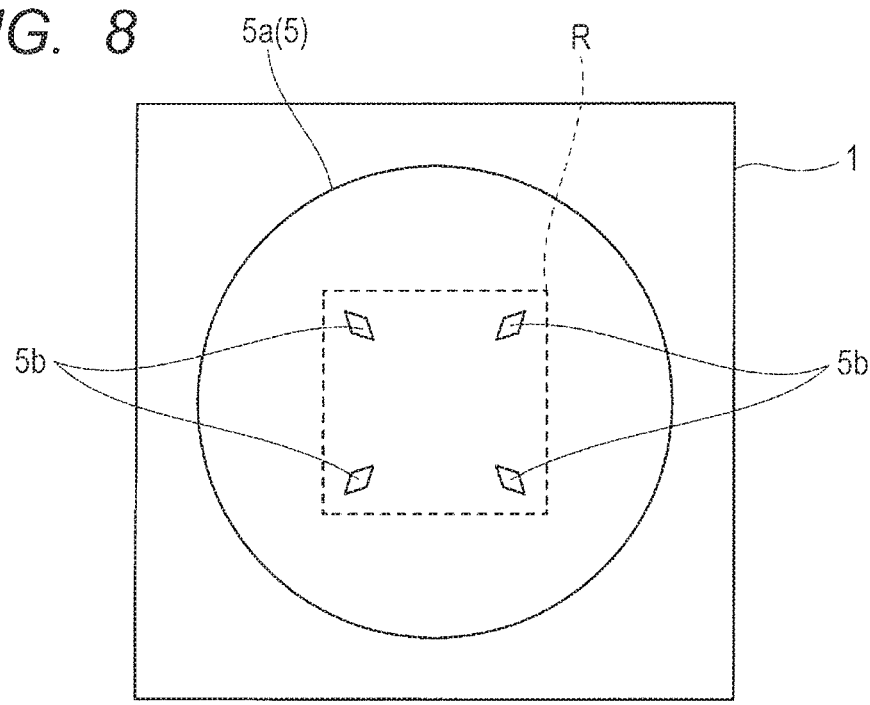
FIG. 8 is a backside view of the ball electrode shown in FIG. 7.

Here, FIG. 7 is a partial side view showing an example of indentations on the ball electrode after the inspection of the semiconductor device of the first embodiment. FIG. 8 is a backside view of the ball electrode shown in FIG. 7. Specifically, FIGS. 7 and 8 show positions of indentations 5b of the pogo pin 8d and indentations 5c of the test pin 8e on the first solder ball 5a.

As shown in FIG. 5, the test pin 8e is bought into contact with the first solder ball 5a at a position which is different from the position where the pogo pin 8d is brought into contact with the first solder ball 5 and which is upper than the position where the pogo pin 8d is brought into contact with the first solder ball 5. Therefore, as shown in FIGS. 7 and 8, the indentations 5b and the indentations 5c are formed at positions different from each other (R region and S region).

Specifically, the test pin 8e is brought into contact with the first solder ball 5a at a position upper than the position where the pogo pin 8d is brought into contact with the first solder ball 5a, so that four indentations 5b of the pogo pin 8d are formed at a lower region (R region) of the first solder ball 5a as shown in FIG. 8. On the other hand, as shown in FIG. 7, four indentations 5c of the test pin 8e are formed on the first solder ball 5a at a side region (S region) that is located upper than the position of the indentations 5b of the pogo pin 8d (R region).

By checking the indentations 5b and 5c formed on the first solder ball 5a in this way, it is possible to check the positions where the pogo pin 8d and the test pin 8e are brought into contact with the first solder ball 5a. In other words, when the inspection of the semiconductor device of the first embodiment is performed, as shown in FIG. 7, on the first solder ball 5a, indentations are formed at two positions, that is, the lower region (R region) and the side region (S region).

Effects of First Embodiment

In the manufacturing method of the semiconductor device of the first embodiment, the test pin 8e is arranged at a position different from the array of a plurality of pogo pins 8d in the socket 8 and a conductive state between the pogo pin 8d and the first solder ball 5a is inspected by bringing a plurality of pogo pins 8d into contact with a plurality of solder balls 5, respectively, and bringing the test pin 8e into contact with the first solder ball 5a of the plurality of solder balls 5 during the inspection. Specifically, the resistance value between the pogo pin 8d and the first solder ball 5a is measured by bringing the test pin 8e into contact with the first solder ball 5a at a position different from the position where the pogo pin 8d is brought into contact with the first solder ball 5. Thereby, a coupling failure between the pogo pin 8d and the first solder ball 5a is detected.

Further, the test pin 8e is arranged at a position different from the array of a plurality of pogo pins 8d in the socket 8, so that it is possible to bring the test pin 8e into contact with the first solder ball 5a at an arbitrary timing.

It is possible to monitor the resistance value between the pogo pin 8d and the first solder ball 5a by bringing the test pin 8e into contact with the first solder ball 5a as needed. Further, it is possible to optimize the inspection in real time by feeding back the resistance value, so that occurrence of pseudo failure can be reduced. In other words, it is possible to monitor a contamination state of the pogo pin 8d, and thereby a defect due to contact failure can be identified.

Further, it is possible to improve a manufacturing yield of the BGA 3 by reducing occurrence of pseudo failure in an inspection process during the assembly of the BGA (semiconductor device) 3.

Further, it is possible to directly monitor an actual contamination state of the pogo pin 8d, so that maintenance of the inspection device 7 can be performed in a timely manner.

Further, it is possible to rescue a semiconductor device (product), which has been determined as pseudo failure, by inspecting the semiconductor device again by an inspection method of the first embodiment. That is, it is possible to reduce occurrence of pseudo failure of the semiconductor device and improve the manufacturing yield of the BGA (semiconductor device) 3.

If a semiconductor device such as the BGA 3 is determined as failure in an inspection after completing the final process of assembly, the semiconductor device that has assembled through the pre-process and the post-process becomes nothing, so that it causes a huge loss. Therefore, it is possible to produce a large cost effect by reducing occurrence of pseudo failure of a semiconductor device that has been determined as failure in an inspection after completing the final process of assembly and rescuing the semiconductor device.

Further, also in the inspection device 7 of the first embodiment, occurrence of pseudo failure in the inspection process during the assembly of the BGA (semiconductor device) 3 can be reduced by performing an inspection in the same manner as the inspection method described in the first embodiment. As a result, it is possible to improve the manufacturing yield of the BGA 3. The other effects obtained by the inspection device 7 are the same as those obtained by the manufacturing method of the semiconductor device, so that redundant description thereof will be omitted.

Second Embodiment

Figure 10:
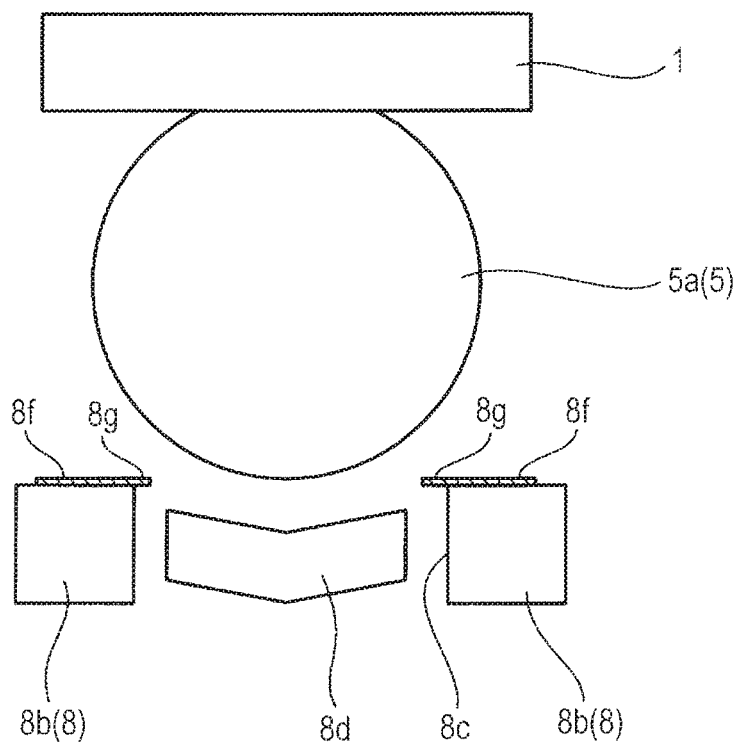
FIG. 10 is a schematic diagram showing a positional relationship among a ball electrode, a first terminal, and a second terminal in the inspection status of the semiconductor device shown in FIG. 9.
Figure 11:
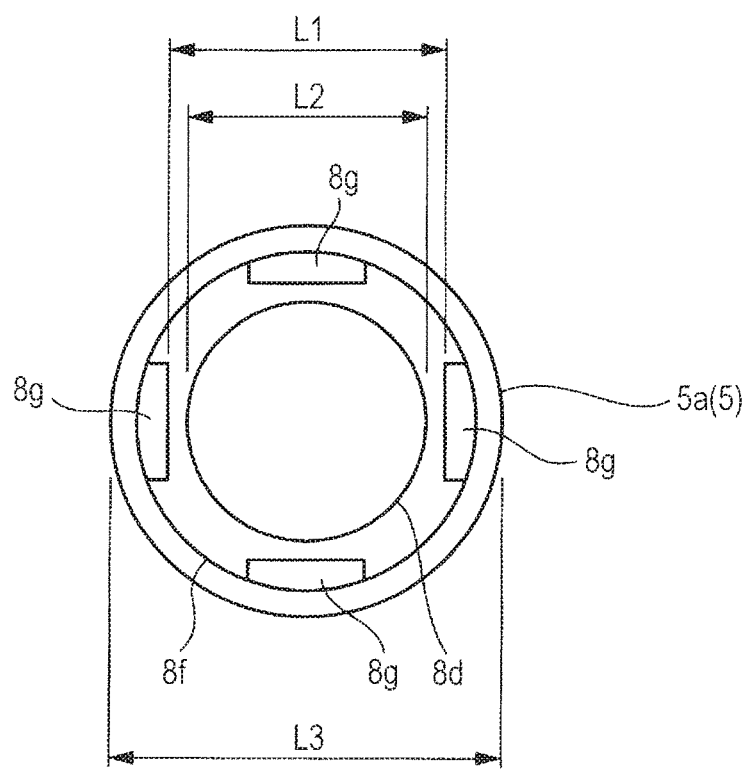
FIG. 11 is a schematic upper view of a structure shown in FIG. 10.
Figure 12:
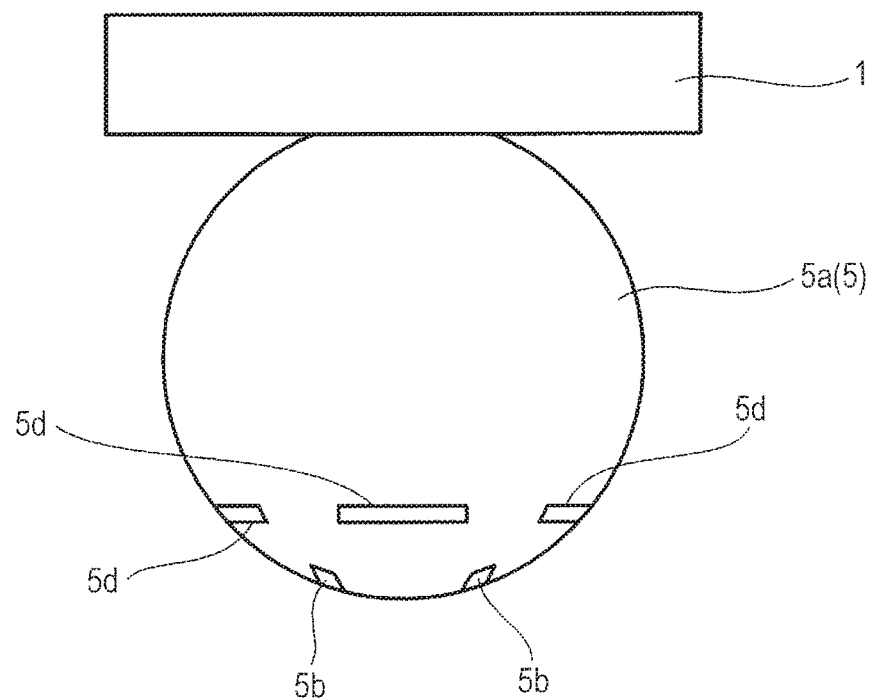
FIG. 12 is a partial side view showing an example of indentations on the ball electrode after inspection of the semiconductor device of the second embodiment.
Figure 13:
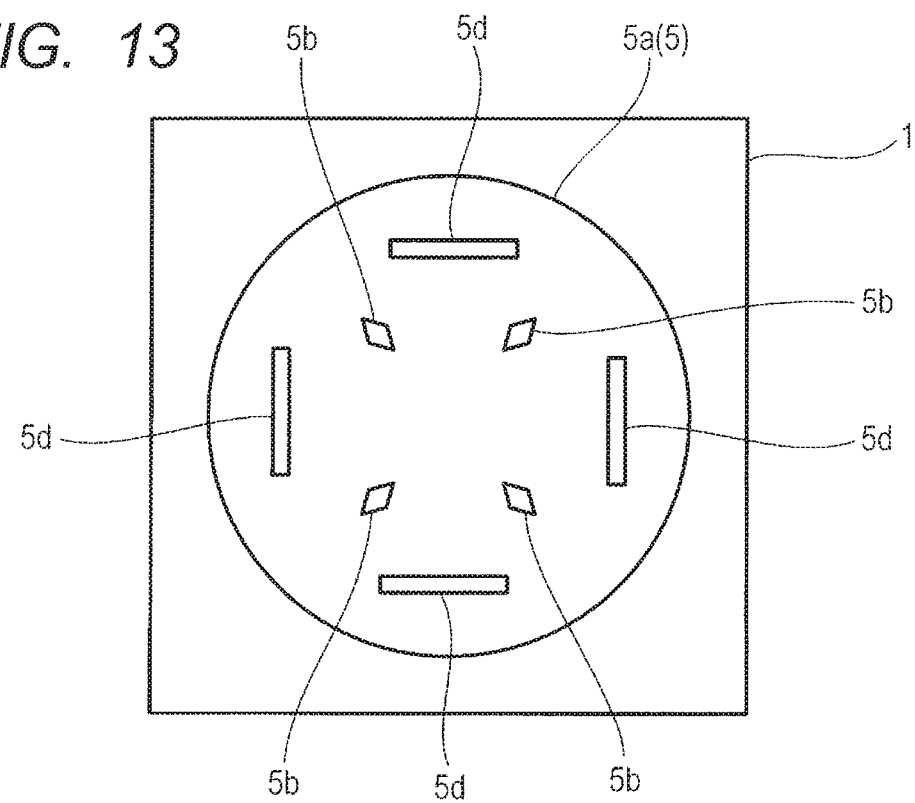
FIG. 13 is a backside view of the ball electrode shown in FIG. 12.

FIG. 9 is a schematic diagram showing an example of an inspection status of a semiconductor device of a second embodiment. FIG. 10 is a schematic diagram showing a positional relationship among a ball electrode, a first terminal, and a second terminal in the inspection status of the semiconductor device shown in FIG. 9. FIG. 11 is a schematic upper view of a structure shown in FIG. 10. FIG. 12 is a partial side view showing an example of indentations on the ball electrode after inspection of the semiconductor device of the second embodiment. FIG. 13 is a backside view of the ball electrode shown in FIG. 12.

First, characteristics of the socked 8 used in the inspection process in the manufacturing method of the semiconductor device of the second embodiment. In the socket 8 used in the second embodiment, as shown in FIGS. 10 and 11, the second terminal provided in the socket 8 is a flange-shaped terminal 8f including a plurality of protrusion portions 8g extending to the hole portion 8c in which the pogo pin (first terminal) 8d of the socket 8 is arranged in plan view. During the inspection, a coupling failure between the pogo pin 8d and the first solder ball 5a is detected by bringing the plurality of protrusion portions 8g of the flange-shaped terminal 8f into contact with the first solder ball 5a.

As shown in FIG. 10, the flange-shaped terminal 8f is provided on a surface of the bottom portion 8b of the socket 8 independently from each pogo pin 8d, and each of the plurality of protrusion portions 8g is arranged to extend over the hole potion 8c of the bottom portion 8b. Although FIG. 10 shows a structure where four long narrow protrusion portions 8g are provided to one flange-shaped terminal 8f, the number of the protrusion portions 8g provided to one flange-shaped terminal 8f is not limited to four but may be a plural number other than four.

Further, although each protrusion portion 8g has a long narrow shape in plan view, the protrusion portion 8g may have any shape as long as the protrusion portion 8g is arranged to extend to the hole portion 8c of the bottom portion 8b of the socket 8 as shown in FIG. 10.

As shown in FIG. 11, regarding the plurality of protrusion portions 8g of the flange-shaped terminal 8f, a distance L1 between one protrusion portion 8g and another protrusion portion 8g facing the one protrusion portion 8g is greater than a diameter (L2) of the pogo pin 8d (L1>L2).

Thereby, the pogo pin 8d can move up and down without coming into contact with the flange-shaped terminal 8f.

In plan view, a diameter L3 of the first solder ball 5a is greater than the distance L1 between the protrusion portions 8g (L3>L1). As a result, as shown in FIG. 11, a relationship among L1, L2, and L3 in plan view is L3>L1>L2.

Therefore, as shown in FIG. 9, when the BGA 3 is lowered and the first solder ball 5a is brought into contact with the pogo pin 8d during the inspection, each protrusion portion 8g of the flange-shaped terminal 8f also comes into contact with the first solder ball 5a. In other words, when the first solder ball 5a lowers from above, each protrusion portion 8g of the flange-shaped terminal 8f comes into contact with the first solder ball 5a at substantially the same time as when the first solder ball 5a comes into contact with the pogo pin 8d.

When the pogo pin 8d lowers to a predetermined position, each protrusion portion 8g maintains a state of being bent and in contact with the first solder ball 5a. Specifically, each protrusion portion 8g extends to the hole portion 8c of the bottom portion 8b of the socket 8, so that even when the pogo pin 8d slightly lowers after coming into contact with the first solder ball 5a, each protrusion portion 8g also bends somewhat and maintains contact with the first solder ball 5a. Thereby, it is possible to perform the conductivity inspection between the pogo pins 8d and the first solder ball 5a in a state in which the first solder ball 5a is in contact with the pogo pin 8d and the flange-shaped terminal 8f (T1 portion and T2 portion in FIG. 9).

It is preferable to place the flange-shaped terminal 8f to only a corner pin and a specific power source pin so that the first solder ball 5a is not electrically short-circuited to another solder ball 5 adjacent to the first solder ball 5a.

During the inspection, as shown in FIG. 9, a contact position (T2 portion) where the flange-shaped terminal 8f is in contact with the first solder ball 5a is upper than a contact position (T1 portion) where the pogo pin 8d is in contact with the first solder ball 5a. Specifically, during the inspection, the plurality of protrusion portions 8g of the flange-shaped terminal 8f is brought into contact with positions on the first solder ball 5a closer to the package substrate 1 than the position where the pogo pin 8d is in contact with the first solder ball 5.

In this case, the contact position (T2 portion) where the flange-shaped terminal 8f is in contact with the first solder ball 5a is located outside the contact position (T1 portion) where the pogo pin 8d is in contact with the first solder ball 5a because the first solder ball 5a has a spherical shape.

Therefore, as shown in FIG. 12, positions of the four long narrow indentations 5d that are formed on the first solder ball 5a by the flange-shaped terminal 8f shown in FIG. 9 are located upper than positions of the four indentations 5b formed by the pogo pin 8d shown in FIG. 9.

Further, as shown in FIG. 13, the positions of the four long narrow indentations 5d that are formed on the first solder ball 5a by the flange-shaped terminal 8f are located outside the positions of the four indentations 5b formed by the pogo pin 8d.

In other words, the indentations 5d formed by the flange-shaped terminal 8f and the indentations 5b formed by the pogo pin 8d are not merely formed at dispersed positions on the first solder ball 5a but they are formed at positions in regions clearly divided into an upper side (on the substrate side) and a lower side (on the lower open-end side) or inside (on the ball center side) and outside (on the side open-end side), respectively, of the first solder ball 5a.

According to the manufacturing method of the semiconductor device of the second embodiment, the flange-shaped terminal 8f is arranged over the bottom portion 8b of the socket 8, so that it is not necessary to install a mechanism that brings the flange-shaped terminal 8f into contact with the socket 8. In other words, the flange-shaped terminal 8f can be placed without largely changing the shape of the existing socket 8, so that it is possible to suppress cost increase due to the socket 8 itself, the number of the sockets 8 mounted over the test board 10, and the like.

Further, in addition to the test board 10, various components (bypass capacitor, dumping resistance, crystal oscillator, high/low-pass filters, and the like) are mounted on areas around a position where the semiconductor device is mounted. Among them, there are many components whose electrical characteristic are largely affected, so that these components should be arranged close to the semiconductor device as much as possible. Therefore, it is possible to improve performance and quality of the inspection of the semiconductor device (BGA 3) of the second embodiment where the size of the socket 8 can be suppressed as compared with that of the first embodiment.

In the same manner, as in the first embodiment, it is possible to reduce occurrence of pseudo failure in the inspection process during the assembly of the BGA (semiconductor device) 3. As a result, it is possible to improve the manufacturing yield of the BGA 3. The other effects obtained by the manufacturing method of the semiconductor device of the second embodiment are the same as the effects obtained by the manufacturing method of the semiconductor device of the first embodiment, so that redundant description thereof will be omitted.

Third Embodiment

Figure 14:
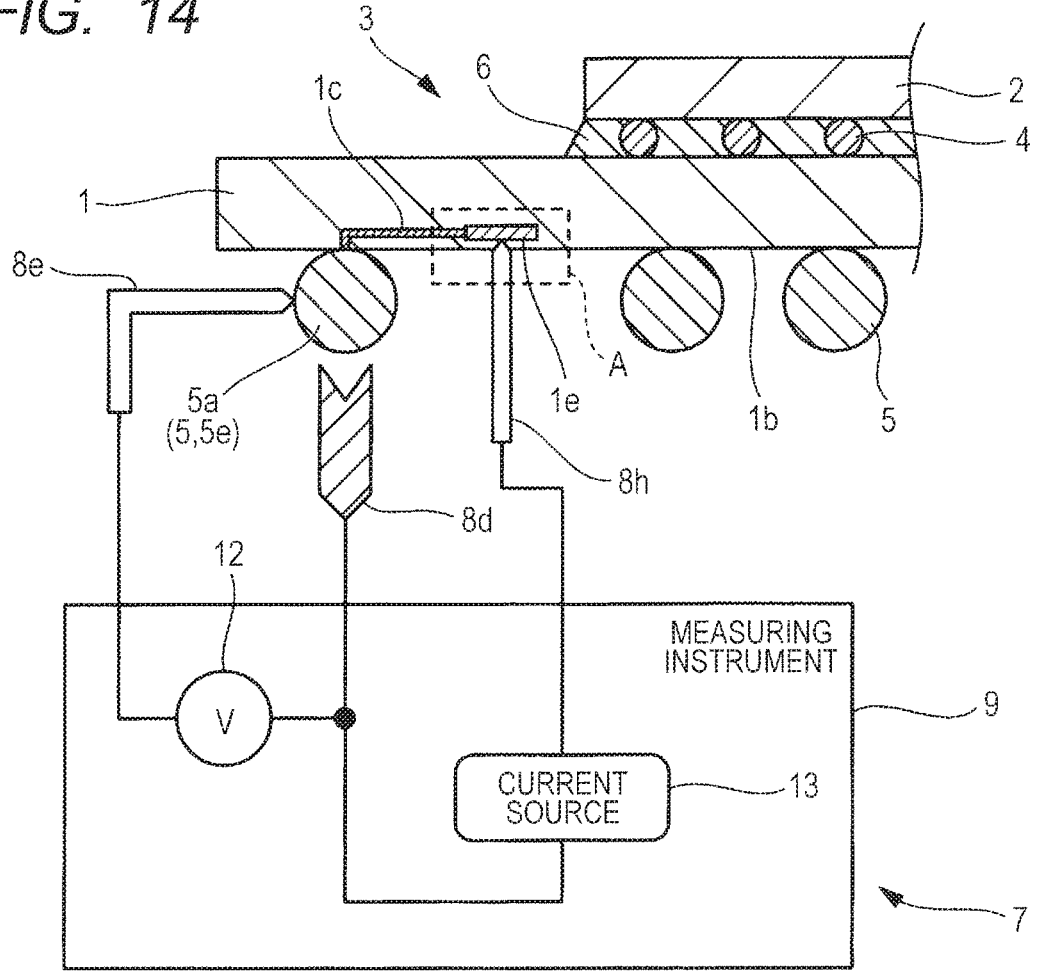
FIG. 14 is a schematic diagram showing an example of an inspection status of a semiconductor device of a third embodiment.
Figure 15:
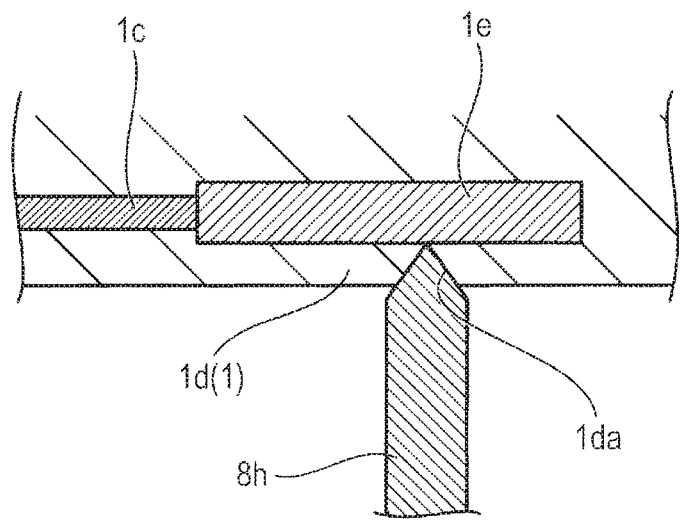
FIG. 15 is an enlarged partial cross-sectional view showing, in an enlarged scale, a structure of a portion A shown in FIG. 14.
Figure 17:
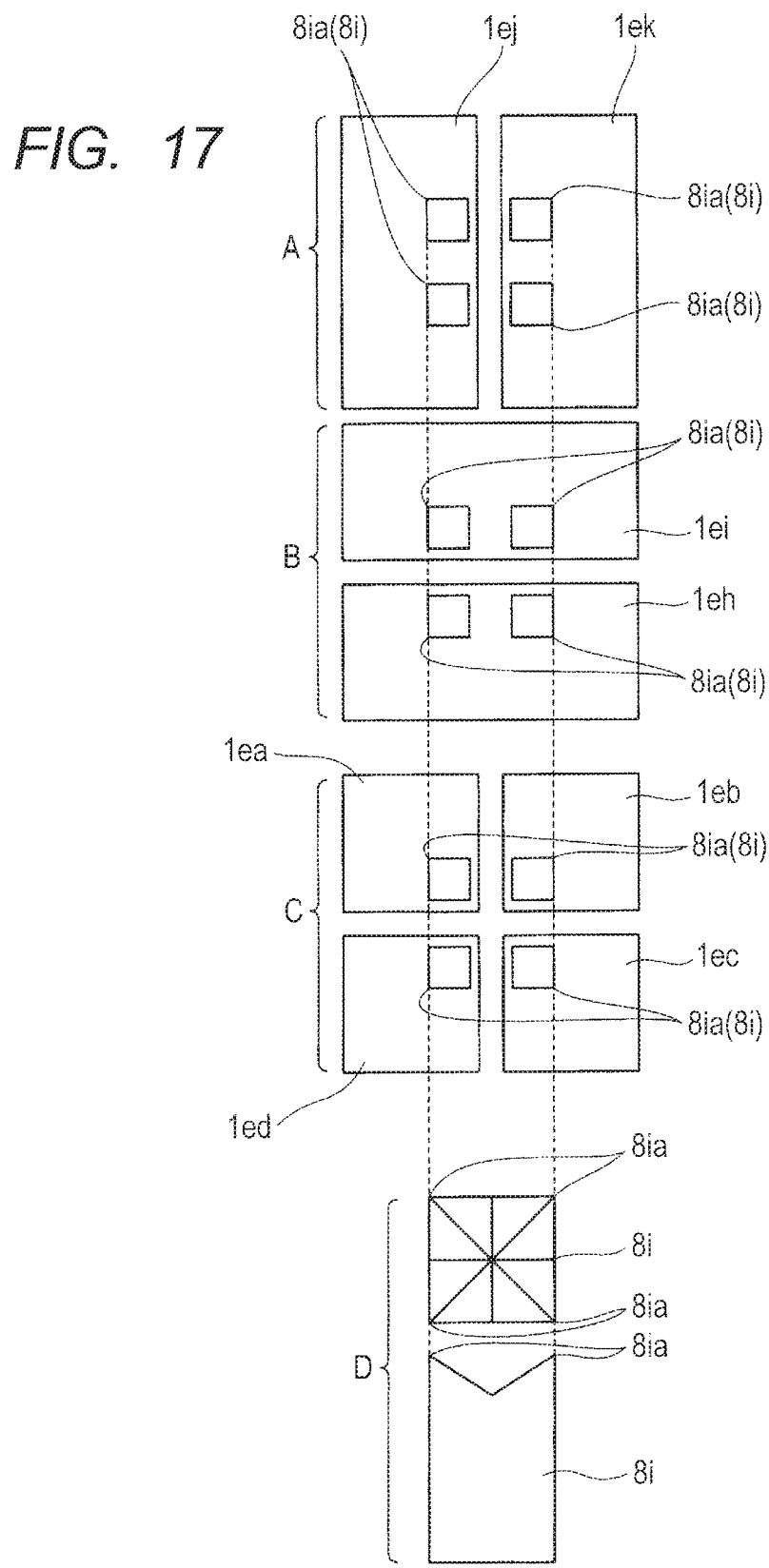
FIG. 17 is a backside view, a plan view, and a side view showing an example of contact positions between the inspection terminals shown in FIG. 16 and first terminals of a socket.

FIG. 14 is a schematic diagram showing an example of an inspection status of a semiconductor device of a third embodiment. FIG. 15 is an enlarged partial cross-sectional view showing, in an enlarged scale, a structure of a portion A shown in FIG. 14. FIG. 16 is an enlarged backside view showing an example of an arrangement of inspection terminals in the semiconductor device of the third embodiment. FIG. 17 is a backside view, a plan view, and a side view showing an example of contact positions between the inspection terminals shown in FIG. 16 and first terminals of a socket.

In a manufacturing method the semiconductor device of the third embodiment, a BGA 3 including a land 1e that is an inspection terminal where no solder ball 5 is mounted is prepared, and a conductive state between the first solder ball 5a of the BGA 3 and the pogo pin 8d is inspected by using the land 1e of the BGA 3.

First, the BGA 3 shown in FIG. 14 will be described. The package substrate 1 installed in the BGA 3 includes a land (inspection terminal) 1e which is provided adjacent to the first solder ball 5a of a plurality of solder balls 5 over the lower surface 1b of the package substrate 1 and which is electrically coupled to the first solder ball 5a and is provided with no solder ball 5.

The land 1e is electrically coupled to the first solder ball 5a through a wiring 1c of the package substrate 1. The land 1e is arranged in a region inside a plurality of solder balls 5 (a second solder ball 5e, a second ball electrode) provided on an outermost circumference of a plurality of solder balls 5. In other words, as shown in FIG. 16, the lands 1e are arranged in a region inside a plurality of ball mounting lands 1fm which are provided on the outermost circumference.

During the inspection, as shown in FIG. 14, a needle pin (third terminal) 8h provided in the socket 8 (see FIG. 1) is brought into contact with the land 1e and a resistance value between the pogo pin 8d and the needle pin 8h is measured by the measuring instrument 9. Thereby, a coupling failure between the pogo pin 8d and the first solder ball 5a is detected.

To explain in details, the inspection device 7 of the third embodiment is provided with the pogo pin (first terminal) 8d, the test pin (second terminal) 8e, and the needle pin (third terminal) 8h as probes electrically coupled to the measuring instrument 9. The pogo pin 8d is electrically coupled to both a terminal of a current source 13 and a terminal of a voltmeter 12. The test pin 8e is electrically coupled to another terminal of the voltmeter 12. And the needle pin 8h is electrically coupled to another terminal of the current source 13. The current source 13 and the voltmeter 12 are provided inside the measuring instrument 9.

In a conductivity inspection of the third embodiment, a ball to be measured (the first solder ball 5a) is limited, an inspection terminal (the land 1e made of metal) to which an inspection current is applied is formed adjacent to the ball to be measured, and the inspection terminal is covered with a solder resist film 1d which is an insulating film as shown in FIG. 15. In short, the land 1e is covered with the solder resist film 1d. Since the land 1e is covered with the solder resist film 1d, it is possible to improve appearance of the BGA 3. Further, it is possible to prevent the land 1e from being damaged.

However, the land 1e need not be covered with the solder resist film 1d and a conductive portion of the land 1e may be exposed.

When the land 1e is covered with the solder resist film 1d, during the inspection, the needle pin 8h is stuck into the solder resist film 1d and brought into contact with the land 1e as shown in FIG. 15, and the inspection is performed in this state. The tip of the needle pin 8h is sharpened, so that it is easy for the needle pin 8h to break through the solder resist film 1d. After the inspection, as a mark made by the needle pin 8h that has been stuck, a hole 1da is formed in the solder resist film 1d that covers the land 1e.

In the socket 8, the needle pin 8h can be stood up at a position corresponding to the position of the land 1e which is an inspection terminal. In other words, in the socket 8, the needle pin 8h can be stood up at an arbitrary position.

When the inspection is performed, the needle pin 8h is caused to penetrate through the solder resist film 1d and is brought into contact with the land 1e which is an inspection terminal, and a current is applied to the land 1e from the current source 13 of the measuring instrument 9 through the needle pin 8h. Here, a current for measuring a resistance value is applied to the land 1e through the needle pin 8h.

In this state, a voltage and a current are measured in the same manner as that of the conductivity inspection of the first embodiment. At this time, it is possible to measure the voltage by bringing the test pin 8e into contact with the first solder ball 5a, so that a more stable measurement of the resistance value can be performed. Further, in the inspection device 7 of the third embodiment, the current source 13 and a voltage source are separately provided, so that it is possible to improve accuracy of the measurement of the resistance value.

In the BGA 3 of the third embodiment, the land 1e only need to be reliably in contact with the needle pin 8h, and the arrangement of the solder balls 5 of the BGA 3 is not restricted. Specifically, there is an empty space for mounting a capacitor on the lower surface (back surface) 1b of the package substrate 1 of the BGA 3. By providing the land 1e, which is an inspection terminal, to the empty space, it is possible to provide the land 1e without restricting the arrangement of the solder balls 5 of the BGA 3.

However, the land 1e may be provided to an empty grid according to the grids of the solder balls 5 of the BGA 3. Thereby, it is possible to easily arrange or form the needle pin 8h in the socket 8 without changing a socket structure, so that it is possible to suppress cost increase of the socket 8.

The shape of the land 1e is not restricted, so that it is possible to increase freedom of design of the substrate.

Next, types of the land 1e shown in FIGS. 16 and 17 will be described. An example shown in FIG. 16 is a case in which an inspection terminal is provided at an empty terminal position of a terminal grid of the package substrate 1. In this case, as the third terminal to be brought into contact with the inspection terminal, it is possible to use the pogo pin 8d shown in FIG. 14 by elongating the length of the pogo pin 8d without using the needle pin 8h shown in FIG. 14.

When there are common GNDs or the like, a large number of which are used in the BGA 3 and which are coupled to a large number of pins of the BGA 3, by coupling the land 1e to the common GNDs through the wiring 1c, it is possible to provide a plurality of terminals to be measured.

In the example shown in FIG. 16, an arrangement and a shape of the land 1e when a tip portion of a pogo pin (the third terminal to be brought into contact with an inspection terminal) 8i of a D portion in FIG. 17 has a plurality of vertexes 8ia are shown, and an example in which a shape in plan view of the land 1e, which is an inspection terminal, is divided into a plurality of shapes according to the number of vertexes 8ia of the tip portion of the pogo pin 8i.

For example, when the tip portion of the pogo pin 8i shown in FIG. 17 includes four vertexes 8ia, in the structure shown in FIG. 16, it is possible to simultaneously perform measurement for a land 1fa (Power 1), a land 1fb (Power 2), a land 1fc (Power 3), and a land 1fd (Power 4) that are respectively coupled to up to four lands 1ea, 1eb, 1ec, and 1ed through the wirings 1c. Even when the tip portion of the pogo pin 8i includes four vertexes 8ia and the land 1e is divided into four parts (portion C in FIG. 17) corresponding to the four vertexes 8ia, not all of the four parts of the divided land 1e need be coupled to a ball mounting land. For example, regarding the four divided lands 1ee, 1ef, 1eg, and 1em shown in FIG. 16, the land 1ee is coupled to the land 1fe (power 1), the land 1ef is coupled to the land 1ff (power 2), the land 1eg is coupled to the land 1fg (power 3). However, the land 1em is not coupled to a ball mounting land.

Further, even when the land 1e is divided into two parts (portion A or B in FIG. 17), it is possible to perform measurement. For example, regarding the two divided lands 1eh and 1ei shown in FIG. 16, the land 1eh is coupled to the land 1fh (fixed signal 1) and the land 1ei is coupled to the land 1fi (fixed signal 2). Further, even when the lands are the same electrode such as GND, it is possible to perform measurement. For example, regarding the two divided lands 1ej and 1ek, the land 1ej is coupled to the land 1fj (GND) and the land 1ek is coupled to the land 1fk (GND).

As shown in FIG. 16, a land 1e which is an inspection terminal is arranged at an empty terminal position of the terminal grid of the package substrate 1, so that it is possible to provide the pogo pin 8i which is the third terminal without changing the socket structure as described above.

In the manufacturing method the semiconductor device of the third embodiment, the number of terminals to be measured is increased by providing the land 1e, which is an inspection terminal where no solder ball 5 is mounted, in the package substrate 1 of the BGA 3, and inspecting a conductive state between the first solder ball 5a of the BGA 3 and the pogo pin 8d by using the land 1e, so that it is possible to stabilize the measurement of the resistance value.

As a result, it is possible to inspect the conductive state between the first solder ball 5a of the BGA 3 and the pogo pin 8d with higher accuracy.

MODIFIED EXAMPLE

Figure 18:
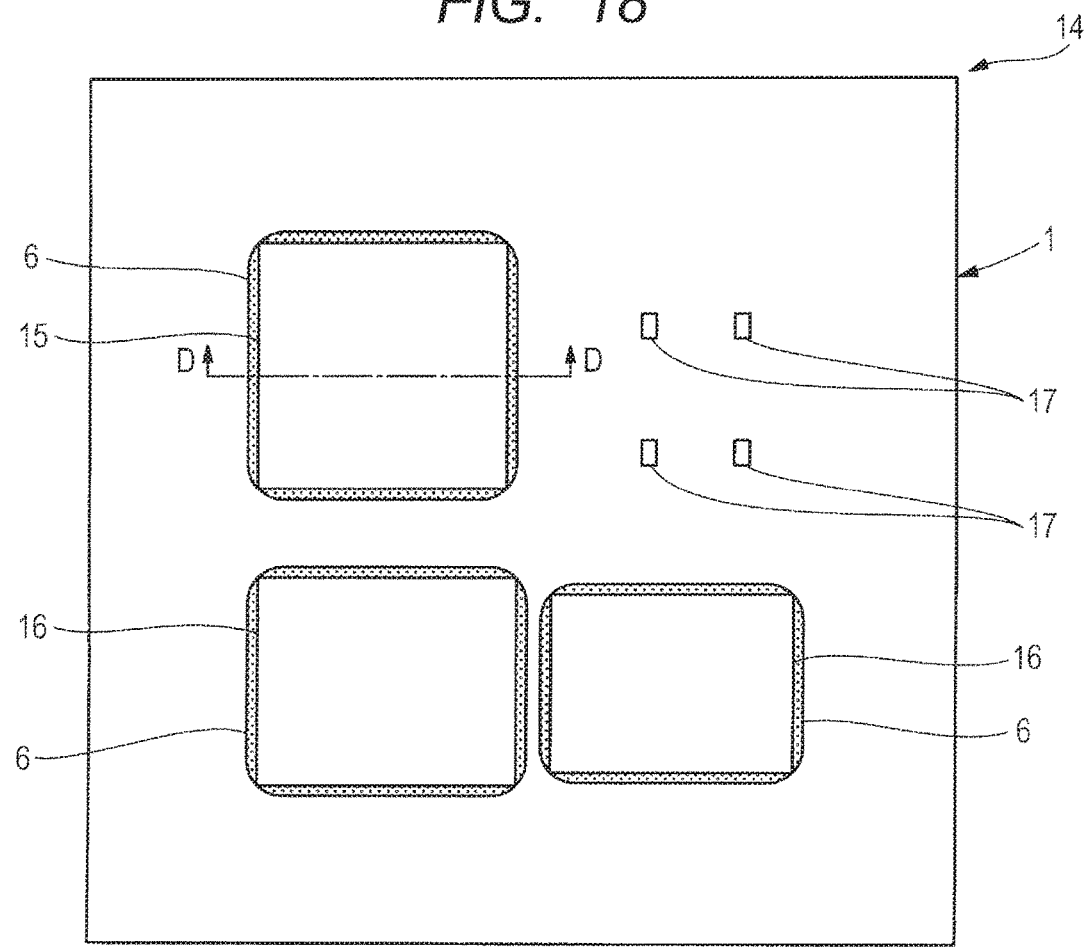
FIG. 18 is a plan view showing an example of a structure of a semiconductor device of a modified example.
Figure 19:
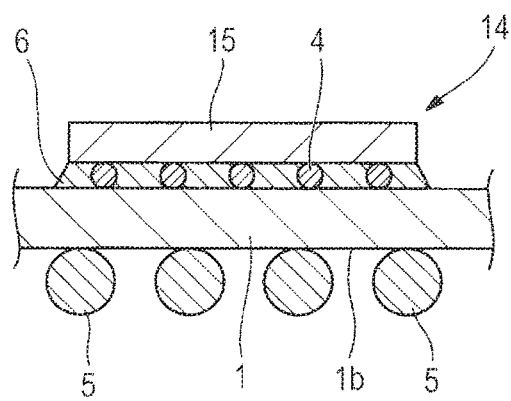
FIG. 19 is a partial cross-sectional view showing a structure taken along line D-D shown in FIG. 18.

FIG. 18 is a plan view showing an example of a structure of a semiconductor device of a modified example. FIG. 19 is a partial cross-sectional view showing a structure taken along line D-D shown in FIG. 18.

In the modified example, a case will be described where the semiconductor device which is inserted into the socket 8 and on which a conductivity inspection is performed is an SIP (System In Package) 14 provided with a plurality of solder balls 5 as external terminals.

The SIP 14 is a semiconductor device of high unit price where a plurality of semiconductor chips are mounted. The SIP 14 shown in FIG. 18 is a BGA type semiconductor device mounted with one microcomputer chip 15, two memory chips 16 controlled by the microcomputer chip 15, and a plurality of electronic components 17 such as a plurality of chip capacitors.

In other words, the SIP 14 is a semiconductor device where the one microcomputer chip 15 and the two memory chips 16 are flip-chip mounted over the package substrate 1. As shown in FIG. 19, a plurality of solder balls 5 arranged in a grid shape are mounted as external terminals on the lower surface 1b of the package substrate 1. Therefore, when the SIP 14 is inserted into, for example, the socket 8 shown in the first to the third embodiments, it is possible to perform a conductivity inspection in the same manner as the inspection methods described in the first to the third embodiments.

The unit price of the SIP 14 is very expensive, so that if the SIP 14 is determined to be a defective product in an inspection after completing a final process of assembly, it causes a huge loss. However, even when the SIP 14 is determined to be a defective product due to a pseudo failure in an inspection after completing the final process of assembly, it is possible to rescue the SIP 14 by performing a conductivity inspection in the same manner as the inspection methods described in the first to the third embodiments, so that it is possible to prevent occurrence of huge loss in cost. That is, it is possible to produces a large effect in cost.

While the invention made by the inventors has been specifically described based on the embodiments, it is needless to say that the present invention is not limited to the embodiments described above and may be variously modified without departing from the scope of the invention.

For example, in the embodiments described above, as a semiconductor device, a BGA having a structure in which each semiconductor chip is mounted over a package substrate by flip-chip mounting is described. However, the BGA described above may be a BGA having a structure in which each semiconductor chip is electrically coupled with the package substrate by wire (metal wire).

What is claimed is:

1. A manufacturing method of a semiconductor device, the manufacturing method comprising the steps of:
   (a) inserting a semiconductor device including a wiring substrate provided with a plurality of ball electrodes as external terminals into an inspection socket; and
   (b) bringing a plurality of first terminals provided in the socket into contact with the ball electrodes, respectively, bringing a second terminal provided in the socket into contact with a first ball electrode of the ball electrodes, and inspecting a conductive state between the first terminal and the first ball electrode,
   wherein in the step (b), a coupling failure between the first terminal and the first ball electrode is detected by measuring a resistance value between the first terminal and the second terminal by bringing the second terminal into contact with the first ball electrode from a direction different from a direction in which the first terminal is brought into contact with the first ball electrode.

2. The manufacturing method of a semiconductor device according to claim 1,
   wherein in the step (b), the second terminal is brought into contact with the first ball electrode from a direction along a surface of the wiring substrate on which the ball electrodes are provided.

3. The manufacturing method of a semiconductor device according to claim 1,
   wherein in the step (b), the second terminal is brought into contact with the first ball electrode at a position closer to the wiring substrate than a position where the first terminal is brought into contact with the first ball electrode.

4. The manufacturing method of a semiconductor device according to claim 1,
   wherein the second terminal is a flange-shaped terminal including a plurality of protrusion portions extending to a hole portion in which the first terminal of the socket is arranged in plan view, and
   wherein in the step (b), the protrusion portions of the flange-shaped terminal are brought into contact with the first ball electrode.

5. The manufacturing method of a semiconductor device according to claim 4,
   wherein in the step (b), the protrusion portions of the flange-shaped terminal are brought into contact with the first ball electrode at positions closer to the wiring substrate than a position where the first terminal is brought into contact with the first ball electrode.

6. The manufacturing method of a semiconductor device according to claim 1,
   wherein the wiring substrate includes a first surface where a semiconductor chip is mounted and a second surface located opposite to the first surface, and further includes an inspection terminal, which is provided adjacent to the first ball electrode and is electrically coupled to the first ball electrode and where no ball electrode is mounted, on the second surface, and
   wherein in the step (b), a coupling failure between the first terminal and the first ball electrode is detected by measuring a resistance value between the first terminal and a third terminal provided in the socket by bringing the third terminal into contact with the inspection terminal.

7. The manufacturing method of a semiconductor device according to claim 6,
   wherein in the semiconductor device, the inspection terminal is covered by an insulating film, and
   wherein in the step (b), the third terminal is stuck into the insulating film and brought into contact with the inspection terminal.

8. The manufacturing method of a semiconductor device according to claim 1,
   wherein after the step (b), the semiconductor device is inserted into the socket and a defective/non-defective determination test of the semiconductor device is performed by bringing the first terminal into contact with at least the first ball electrode.

\* \* \* \* \*